(12) United States Patent
Takahashi et al.

(10) Patent No.: US 8,602,805 B2
(45) Date of Patent: Dec. 10, 2013

(54) SOCKET

(75) Inventors: Hideyuki Takahashi, Shizuoka (JP); Hideki Sano, Shizuoka (JP)

(73) Assignee: Sensata Technologies Massachusetts, Inc., Attleboro, MA (US)

( * ) Notice: Subject to any disclaimer, the term of this patent is extended or adjusted under 35 U.S.C. 154(b) by 249 days.

(21) Appl. No.: 13/251,348

(22) Filed: Oct. 3, 2011

(65) Prior Publication Data

US 2012/0129379 A1    May 24, 2012

(30) Foreign Application Priority Data

Nov. 19, 2010    (JP) ................................. 2010-258609

(51) Int. Cl.
*H01R 13/62*    (2006.01)
(52) U.S. Cl.
USPC ........................................... 439/331; 439/73
(58) Field of Classification Search
USPC .............. 439/331, 73, 342, 265, 266, 268, 71
See application file for complete search history.

(56) References Cited

U.S. PATENT DOCUMENTS

| | | | |
|---|---|---|---|
| 6,193,525 B1 * | 2/2001 | Takayama | 439/71 |
| 6,984,142 B2 * | 1/2006 | Shimizu | 439/268 |
| 7,618,277 B2 * | 11/2009 | Sato | 439/331 |
| 7,874,863 B1 * | 1/2011 | Hwang | 439/331 |
| 7,918,679 B2 * | 4/2011 | Hwang | 439/331 |
| 8,388,365 B2 * | 3/2013 | Takahashi et al. | 439/331 |
| 2010/0248518 A1 | 9/2010 | Takahashi et al. | |

FOREIGN PATENT DOCUMENTS

JP    2009140629    6/2009

* cited by examiner

*Primary Examiner* — Xuong Chung Trans
(74) *Attorney, Agent, or Firm* — Chapin IP Law, LLC

(57) ABSTRACT

A socket (100) of the present invention includes a base member (20), a cover member (30), a plurality of contacts (40), a latch member (60A) that is rotatably supported by the base member (20) and rotates in response to movement of the cover member (30), an adaptor (50) providing a mounting surface for an IC package and attached with the base member (20) so as to move in an up and down direction in response to the movement of the cover member (30), and a latch plate (200) rotatably attached with the adaptor (50A) and urged by an elastic member. The adaptor (50A) is formed with a latch guide (58) that moves the latch plate (200) in the vertical direction when the latch plate (200) presses the IC package.

9 Claims, 15 Drawing Sheets sectional view taken at X-X line of FIG. 1

(a) perspective view A (b) perspective view B 50 adaptor (a)

(b)

(c)

sectional view taken at X1-X1 line of FIG. 4 sectional view taken at X2-X2 line of FIG. 8

SOCKET

FIELD OF THE INVENTION

The present invention relates to a socket for a semiconductor device, and more particularly, relates to a socket for a semiconductor device with terminals arranged in a two dimension array such as BGA (Ball Grid Array) and LGA (Land Grid Array) packages.

BACKGROUND OF THE INVENTION

Semiconductor devices such as BGA and LGA packages are subjected to a burn-in test prior to shipment, which applies stresses due to a high temperature to the semiconductor device. This eliminates devices in advance in which failures would occur in a certain period after shipping. Sockets used for the burn-in test generally are in two types. One is an open-top type socket whose cover member is vertically reciprocated. The other is a clamshell type socket whose cover member is rotated. For an open-top type socket, JP published application No. 2009-140629, U.S. Publication No. 2010-0248518 A1 (patent document 1) which is incorporated herein by reference, for example, discloses a socket that enables mounting and removing precisely an electronic device including surface mounted semiconductor devices such as BGA and Chip Scale Package (CSP) devices.

BRIEF DESCRIPTION OF THE EMBODIMENTS

FIG. 1 shows a configuration of a conventional socket described in the patent document 1. FIG. 1(a) is a plan view, FIG. 1(b) is a side view, and FIG. 1(c) is a front view. FIG. 2 is a sectional view taken at line X-X of FIG. 1(a). FIG. 3 is a perspective view showing the appearance of the socket.

A socket 10 includes a base member 20 made of an electrically insulated resin, a cover member 30 made of an electrically insulated resin and reciprocatably movable to be adjacent to or separated from the base member 20, and a plurality of contacts 40 mounted in the base member 20.

As shown in FIG. 2, the plurality of contacts 40 corresponding to the number of terminals of the BGA Chip to be mounted in the socket are positioned and aligned in the X and Y directions respectively in the center of the base member 20. The mounting methods of contacts 40 includes, for example, the use of a separator type that laminates the aligned contacts with a separating sheet made of an insulating material alternately, or another type wherein each contact is inserted into a hole of a matrix array in a molded unit of the socket.

A contact unit 24 is inserted from the lower of base member 20 and fixed with the base member 20 so that the lower surface of contact unit 24 can be conformed with the bottom surface of the base member 20. The lower end of each contact 40 is projected from the bottom surface of the base member 20 and the upper end of each contact 40 is positioned to be able to be electrically contacted with each solder ball of BGA package. A curved elastically deformable portion (not shown in the drawings) is formed between the lower and upper ends of the contact, which generates a necessary contact pressure between the upper end of the contact 40 and the solder ball.

An upstanding post 31 is provided at each corner of the cover member 30, a coil spring 32 is wound around each post 31 to urge the cover member 30 constantly in an upward direction (open position) to be separated from the base member 20. A pair of slots 34 that define the vertical stroke of the cover member 30 are formed in the opposite sidewalls 33 of the cover member 30 and each slot is engaged with a rotational axis member 61 of a latch member 60. When the rotational axis member 61 is contacted with the lowest end of the slot 34, the cover member 30 is in a most separated position (open position) from the base member 20. When the rotational axis member 61 is contacted with the highest end of the slot 34, the cover member 30 is in a closest position to the base member 20 (closed position). A rectangular aperture 35 is formed at the center of cover member 30 for mounting, for example, a BGA package on an adapter or mounting member 50 through the aperture 35.

The adapter 50 is movable in a up and down direction and is attached on an adapter mounting surface 26 at the center in the base member 20 with the adaptor 50 providing a mounting surface 52 for BGA package as shown in FIGS. 4 and 5. A pair of hooks 54 is provided at the both sides of the adaptor 50 for engagement with a pair of apertures respectively formed in the base member 20. The adapter 50 is biased by a coil spring, which is not shown in the drawings and is supported by the engagement of the hooks 54 in the apertures. When a large force is applied against the adaptor 50, the adaptor 50 descends against the coil spring. The adaptor 50 is formed with a plurality of through holes 55 in the mounting surface 52, the through holes 55 corresponds to the positions of each contact 40. The upper end of each contact 40 projects from the adaptor mounting surface 26 and extends into the through hole 55. When the adaptor 50 is in its upper most position urged by the coil spring, the upper end of each contact 40 remains in the through hole 55 without projecting from the mounting surface 52.

Also, the mounting surface 52 of the adaptor 50 is formed with upstanding guide portions 56 at its periphery and the guide portions 56 include an inclined surface. The guide portion 56 guides the BGA package along the inclined surface onto the mounting surface 52. Additionally, a plate guide portion 58 for guiding a latch plate 70 in the vertical direction is formed adjacent to the guide portion 56. The plate guide portion 58 has a step structure including an inclined surface 58a and a vertical surface 58b and a latch plate 70 (to be described below) is moved along the plate guide portion 58 by contacting it, so that a pressing portion of the latch plate 70 is allowed to move in a vertical direction while being parallel with the mounting surface 52 and the upper surface of BGA package, without an arc movement. A positioning mechanism, which is not shown in the drawings, is installed at a corner 59 of the adaptor 50. The positioning mechanism is operated by the reciprocating movement of the cover member 30 and includes pressing member that moves in a diagonal direction of the mounting surface 52. By pushing BGA package at the diagonal direction with the pressing member, the BGA package is positioned.

The latch member 60 includes, as shown in FIG. 6, a pair of rotational axis members 61 formed at both sides, a pressing portion 64 having an arc-shaped surface which extends from the rotational axis member 61 at one side, and an extending portion 66 extending from the rotational axis 61 at the other side. The pressing portion 64 is formed with a pair of cylindrical projecting portions 62 at the both sides and the extending portion 66 is formed with an elongated hole 63 along the extending direction. The pair of the latch members 60 is attached with the base member 20 so as to be rotated around the rotational axis members 61.

As shown in FIG. 7, the latch member 60 is disposed in a space between a pair of sidewalls 72 of the latch plate 70 and the latch plate 70 is attached to the top of the pressing portion 64 of the latch member 60. That is, each projecting portion 62 of the latch member 60 is inserted into each slot 74 of the latch plate 70. The width of the slot 74 in the shorter side is slightly larger than the diameter of the projecting portion 62, thereby allowing the projecting portion 62 of the latch member 60 to be able to move in the slot 74 at the perpendicular direction with respect to the axis and to rotate around the projecting portion 62 as the fulcrum. A coil spring 67 is intervened between a projecting portion 79 of a pressing portion 78 of latch plate 70, and a recess portion of the latch member 60, and the projecting portion 62 is abutted to one end of the slot 74 by the coil spring 67 to urge the latch plate 70 so as to be separated.

The rotational axis member 61 of the latch member 60 is attached with the base member 20, and when the latch member 60 is rotated in response to the movement of the cover member 30, two projecting portions 76 provided at the sidewalls 72 of the latch plate 70 are slid on the plate guide portion 58 of the adaptor 50. This is the vertical movement along the plate guide portion 58, which is different from the arc movement of the latch member 60. As show in FIG. 2, links 80 are disposed at the both sides of a pair of the latch members 60. An axis member 82 provided at one end 81 of the link 80 is received in the elongated hole 63 of the latch member 60. Other end 83 of the link 80 is rotatably supported by the cover member 30 through an axis member 84. Additionally, the one end 81 of the link 80 is able to slide on the cam surface 28 formed at the base member 20.

When the cover member 30 is moved downward toward the base member 20 and the axis member 82 of the link 80 comes in contact with the cam surface 28, then the rotation of the link 80 around the axis is started. The one end 81 of the link 80 starts to slide following the can surface 28, whereby the axis member 81 of the link 80 is guidedly moved in the elongated hole 63, so that the latch member 60 is rotated around the axis member 61. Top of the latch member 60 is rotated outside as if it depicts the arc trajectory from the position above the adaptor 50. When the cover member 30 is fully stroked or fully pushed down, the top of the latch member 60 and the latch plate 70 are moved to the outermost position or the evacuated position away from the adaptor mounting surface 52.

By pushing down the cover member 30, the link 80 is rotated in response to the movement, the latch member 60 is rotated in response to the rotation of the link 80, and top of the latch member 60 and the latch plate 70 are moved to the evacuated position from the mounting surface 52. At this time, socket 10 is positioned for receiving BGA package on the mounting surface 52 of the adaptor 50 through the opening 35 in the cover member 30. The BGA package is introduced along the guide portion 56 of the adaptor 50 and seated on the mounting surface 52 of the adaptor 50. At this time, the adaptor 50 is kept upward by the coil spring, thus the top ends of each contact 40 remains in the through hole 55 without projecting from the mounting surface 52. Accordingly, in this case when the BGA package is seated on the mounting surface 52, the top ends of each contacts 40 are not contacted with the solder balls 3.

When the cover 30 is moved upward, then the link 80 is also moved upwardly, thereby causing the latch member 60 to rotate and the latch plate 70 connected with the top of the latch member 60 to also move inside toward BGA package 1. Before the pressing portion 78 of the latch plate 70 is contacted with the BGA package 1, the projecting portion 76 of the latch plate 70 comes in contact with the vertical surface 58b of the plate guide portions 58 that are formed in the adaptor 50 and the movement of the latch plate 70 is changed from a rotational one by the latch member 60 to a vertical one, thus the pressing portion 78 is descended while keeping the parallel position with respect to of the BGA package. This allows the latch plate 70 to press the top surface of the BGA package from straight above without a circular or horizontal motion. At this movement, the contact point of the pressing portion 64 of the latch member 60 is slid on the pressing portion 78 of the latch plate 70 in a horizontal direction.

In response to the further upward movement of the cover member 30, the BGA package 1 is further pushed down by the latch plate 70. This results in the top end of each contact 40 being projected from the mounting surface 52 of the pressed adaptor 50 for contacting with the solder balls. Furthermore, the latch member 60 pushes down the BGA package 1 by rotating around the rotational axis member 61 until the spring force lifting the cover member 30 up and the contacting force of the contacts 40 are balanced. That is, the contacts 40 are distorted elastically for generating a contact force corresponding to the force (pressure force) by the latch member 60, which thereby allows the contact 40 to make electrical contact with the solder ball 3.

Using the latch plate 70 prevents the top surface of the BGA package from being scratched and allows the BGA chip to be pressed only in the vertical direction. However, since the width of the latch plate is restricted by the width of the latch member, there are problems with obtaining a larger area for pressing on an IC package, especially for a large sized IC chip. In addition, in the case of thin IC chip, the IC chip can be easily deformed by the reaction force from the contacts, which makes it desirable to press the whole surface of the IC chip.

The purpose of this invention is to provide a socket that solves the conventional problems and especially as they relate to large sized and thin IC chips.

Further, the purpose of this invention is to provide a novel socket that distributes the reaction force from the contacts to an electrical device and prevents the deformation of the electrical device by pressing the whole surface of the electrical device.

A socket according to the present invention comprising, a base member, a cover member movably attached with the base member, the cover member reciprocating to be adjacent to and/or separated from the base member, a plurality of contacts, each contact fixed with the base member and having an elastically deformable portion between first and second ends; a latch member rotatably supported with the base member, the latch member rotating in response to the position of cover member, the latch member being in a position that the latch member can press an electronic device when the cover member is in a separated position from the base member, and the latch member being in an evacuated position when the cover member is in an adjacent position to the base member, a mounting member attached with the base and providing a mounting surface for the electronic device, the mounting member movable in a rising and falling direction in response to the position cover member, and a latch plate rotatably attached with the mounting member and urged at a first direction by an elastic member. The mounting member is formed with a latch plate guide that moves the latch plate in the vertical direction when the latch plate presses the electronic device. The latch member makes the latch plate rotate at a second direction opposed to the first direction by contacting with the latch plate when the latch member is moved from the evacuated position to the pressable position.

Preferably, the latch plate includes a flat surface nearly parallel to the surface of the electronic device when the latch member is in the pressable position and latch plate is moved in the vertical direction. Preferably, a pair of latch members is disposed in opposition of each other with a pair of latch plates likewise disposed so as to correspond to the pair of latch members, the pair of latch plates pressing substantially whole surface of the electronic device. Preferably, the latch plate includes a pair of sidewalls and a pressing portion connecting the sidewalls, the pair of sidewalls formed with axis member that is rotatably engaged with the mounting member, opposing ends of the pressing portion are formed with tabs that extend outside the sidewalls. Preferably, the mounting member is formed with guides for introducing the electronic device and wherein the pressing portion of the latch plate is positioned at the same position as the guides or behind the guides when the latch plate is rotated at the first direction. Preferably, the latch plate includes a projecting portion, the projecting portion sliding in the latch plate of the mounting member in a vertical direction. Preferably, the latch plate includes a pair of sidewalls and a pressing portion connecting the sidewalls, the pressing portion having a first flat main surface which is contactable with the top surface of the electronic device, the latch member received between the sidewalls, the pressing portion of the latch member pressing a second main surface opposing to the first main surface. Preferably, the socket further includes a coil spring wound around an axis that urges the latch plate in the first evacuated direction, then when the latch plate is moved to the pressing position, the contacting portion of the latch member will slide on the second surface of the latch plate thereby moving the latch plate in the vertical direction. Preferably, the mounting member is formed with a plurality of through holes at the mounting surface, each through hole corresponding to each contact. The first end of each contact will project from the mounting member when the mounting member is moved toward the base member due to the force by the latch plate on the electronic device.

TECHNICAL ADVANTAGE OF THE INVENTION

According to the present invention, by only having vertical movement of the latch plate and by enlarging the area of the latch plate and by expanding the pressing area, the scratches and damages for ultra thin semiconductor packages due to the latch member are reduced.

BRIEF DESCRIPTION OF THE DRAWINGS

FIG. 1(a) is a plan view, FIG. 1(b) is a side view, and FIG. 1(c) is a front view;

FIG. 4(a) is a plan view, FIG. 4(b) is a side view, and FIG. 4(c) is a front view;

FIG. 10(a) is a top view and FIG. 10(b) is a front view;

FIG. 11(a) is a plan view and FIG. 11(b) is a front view;

FIG. 16(a) shows an example of the size of a BGA package. FIG. 16(b) is an exemplary plan view of the socket.

DETAILED DESCRIPTION OF PREFERRED EMBODIMENTS

A socket according to present invention is preferably carried out as a test socket and described hereinafter with reference to the figures in detail. It should be noted that the scale in the figures is represented to understand the present invention easily and it does not express the actual scale of products.

Figure 8:
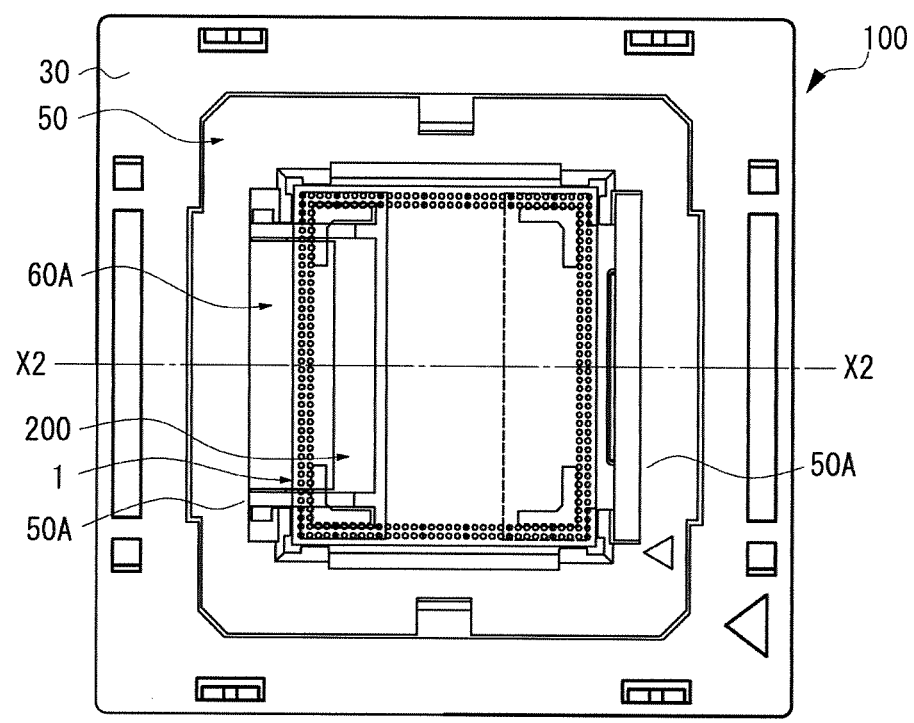
FIG. 8 is an exemplary plan view of a socket according to an embodiment of the present invention.

FIG. 8 is a plan view of an exemplary socket according to an embodiment of the present invention. The socket 100 according to the embodiment has basically the same configuration as the conventional socket 10 described in FIGS. 1 to 7, however the socket 100 includes a latch plate 200 that is newly designed. In this embodiment, the latch plate 200 is, as described hereinafter, rotatably attached with the adaptor or mounting member 50A so as to align with the latch member 60. This allows the latch plate 200 to press the whole top surface of a semiconductor device such as a BGA package uniformly which is especially useful with large-sized and/or thin IC packages.

Figure 10:
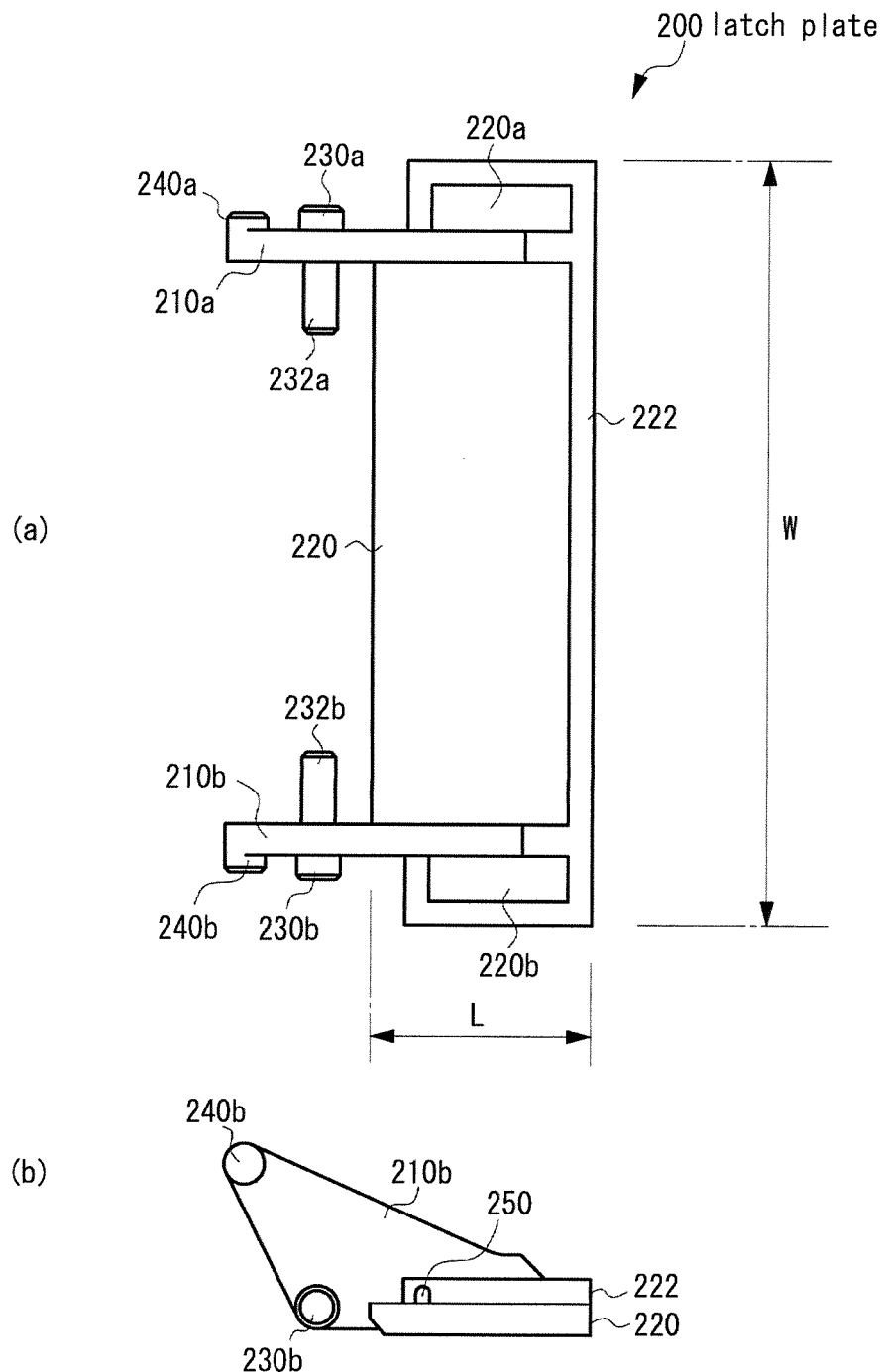
FIG. 10 shows the latch plate according to an embodiment of the present invention.

FIG. 10(a) is a top view of the latch 200 of the embodiment and FIG. 10(b) is a front view of it. The latch plate 200 includes a pair of sidewall 210a, 210b (collectively, sidewall 210) oppositely opposing each other with a plate like pressing portion 220 connecting the two sidewalls 210a, 210b. The pressing portion 220 is a generally rectangular-shaped and includes a flat surface at least at its bottom. Also, the upper surface of the pressing portion 220 is formed with rib 222 with a predetermined height along the periphery of it for reinforcement. Furthermore, rectangular-shaped tabs 220a, 220b extending beyond the sidewalls 210a, 210b are provided at the opposite ends of the pressing portion 220. The tabs 220a, 220b are received in a notch portion (clearance portion) 56a (see FIGS. 11 and 12) of the adaptor 50A when the latch plate 200 is rotated to the open position. The width W and length L of the pressing portion 220 can be suitably selected based on the outer size of the IC package to be mounted on the socket 100.

The pair of sidewalls 210a, 210b extends nearly vertically from the both ends of the pressing portion 220. Cylindrical axis members 230a, 230b that extend outward are provided at the sidewall 210a, 210b, respectively. Each axis member 230a, 230b is received in a vertically elongated hole 59a (see FIG. 11) formed in the adaptor 50A, so that the latch plate 200 is movable within the longitudinal hole 59a in relation to the adaptor 50A and is rotatably attached therewith. Each axis member 230a, 230b includes an extended portion 232a, 232b inside the sidewall 210a, 210b, and a spring coil 300 is wound around each extended portion 232a, 232b respectively.

Additionally, guide members 240a, 240b (collectively, the guide 240) extending outward are provided at the top of the sidewall 210a, 210b as shown in FIG. 10(a). The guide members 240a, 240b are preferably cylindrical or round-shaped. The guide members 240a, 240b can move along the plate guide portion 58 (see FIGS. 5 and 11) adjacent the guide portion 56 of the adaptor 50A. When the guide members 240a, 240b are slid on the plate guide portion 58, the movement of the latch plate 200 is regulated in the vertical direction.

Each coil spring 300 is wound around the extended portions 232a, 232b of the sidewalls 210a, 210b. One end of each coil spring is fixed in a hole 250 formed in the rib 222 of each sidewall 210a and 210b and the other end of each coil spring 300 is fixed at a predetermined position of the adaptor 50A. Thus, the latch plate is constantly urged in a direction to be separated from the mounting surface 52 of adaptor 50A by the coil springs 300.

Figure 11:
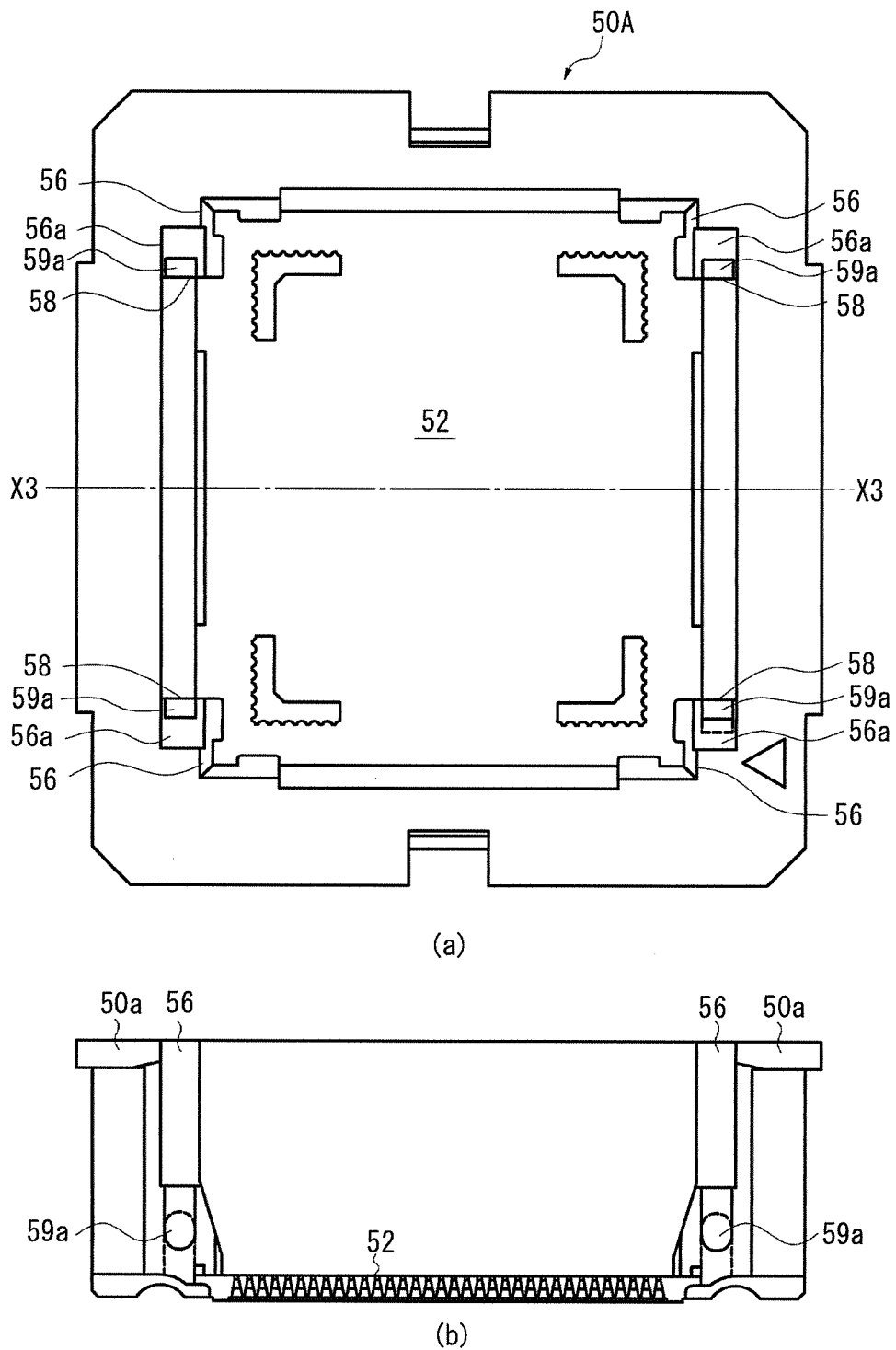
FIG. 11 shows an adaptor according to an embodiment of the present invention.

FIG. 11 shows a plan view of the adaptor according to present invention and a sectional view taken at X3-X3 line. The adaptor (mounting member) 50A according to this embodiment is basically the same as the conventional adaptor 50 described in FIG. 4. In the adaptor 50A of this embodiment, a notch portion 56a is formed adjacent the guides 56 at the corner of the mounting surface 52. The notch portion 56a, as described above, receives the tabs 220a, 220b when the latch plate 200 is rotated to the evacuated open position. At the lower position of the notch portion 56a, a longitudinal hole 59a is formed which receives the axis members 230a, 230b of the latch plate 200 so that the latch plate 200 can be slid and rotated. As the result, the latch plate 200 can move vertically starting from the position slightly above the BGA package when the latch plate 200 is being position to move in contact with the top surface of the BGA package while also tolerating the thickness of the BGA package.

Figure 1:
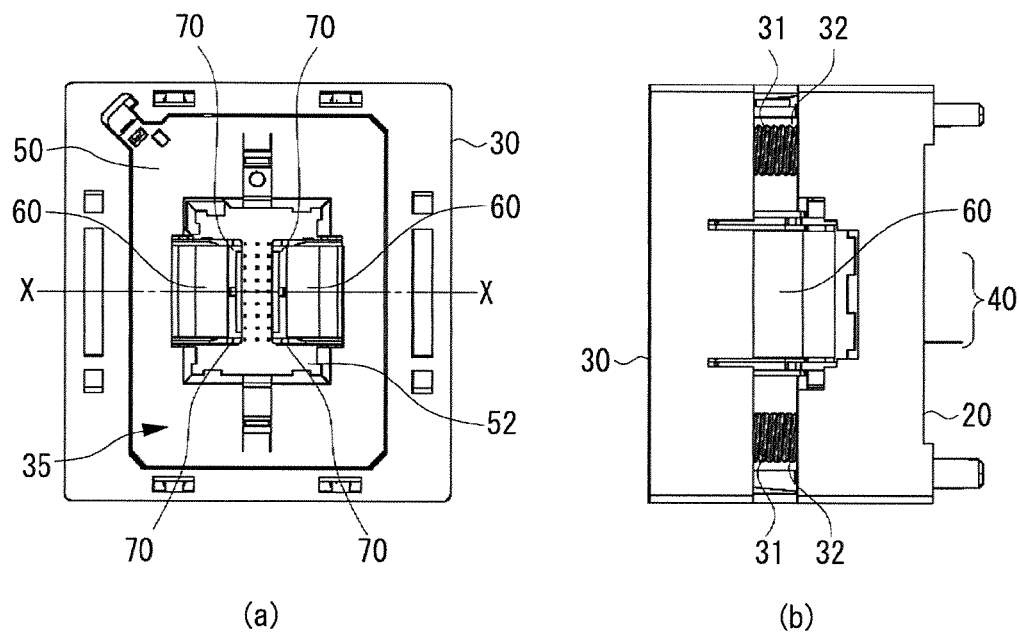
FIG. 1 shows a conventional socket.
Figure 2:
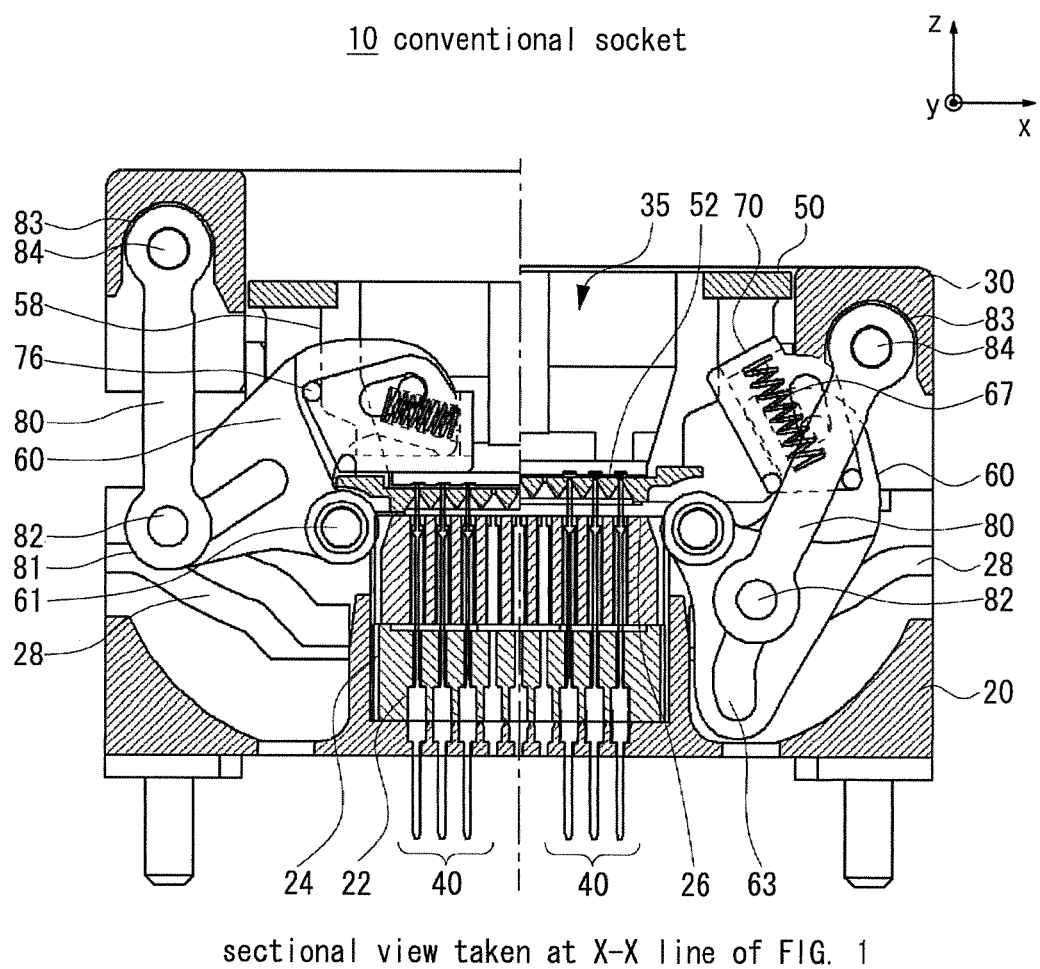
FIG. 2 is a sectional view taken at X-X line in FIG. 1(a). The left half of FIG. 2 shows that the cover member is urged upward and the latch member is in a position ready to press. The right half shows that the cover member is fully stroked downwardly and the latch member is in an evacuated position.
Figure 3:
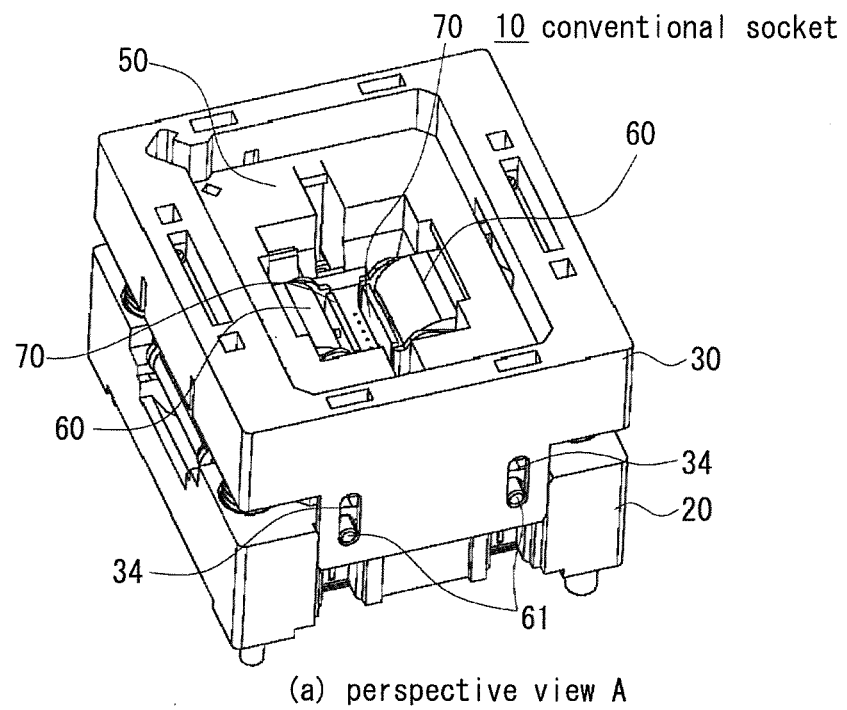
FIG. 3 is a perspective view for showing the appearance of the socket.
Figure 3:
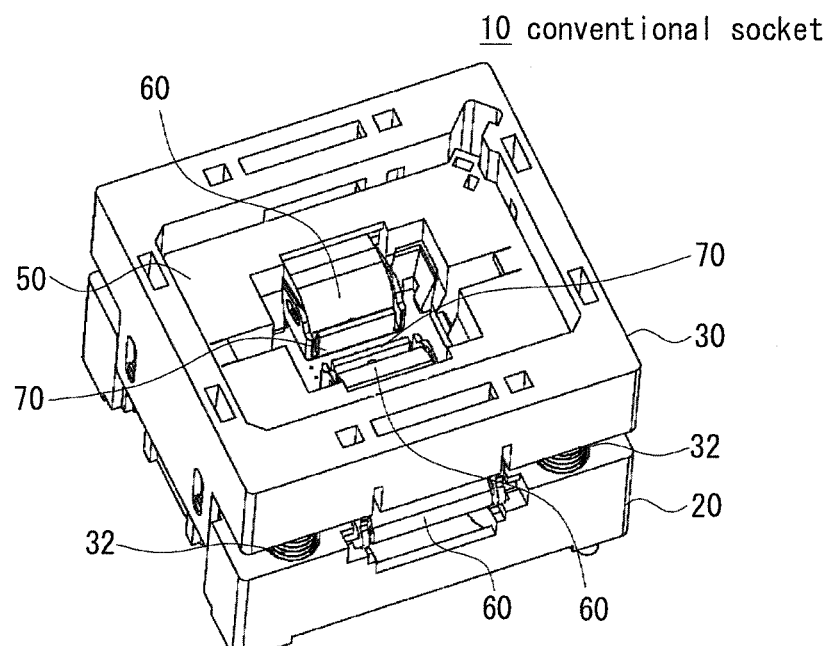
Figure 4:
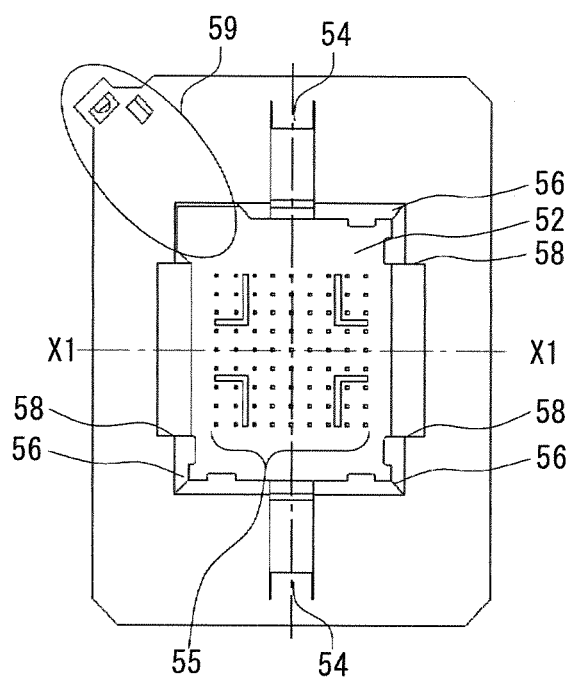
FIG. 4 shows an adaptor.
Figure 4:
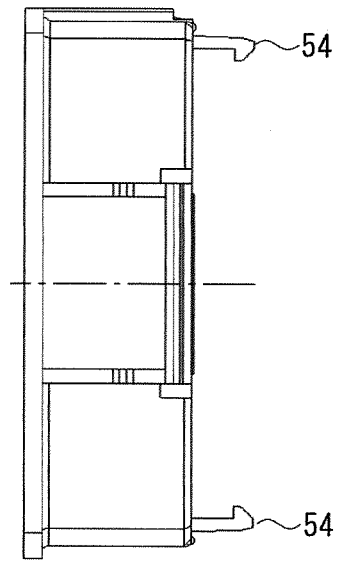
Figure 4:
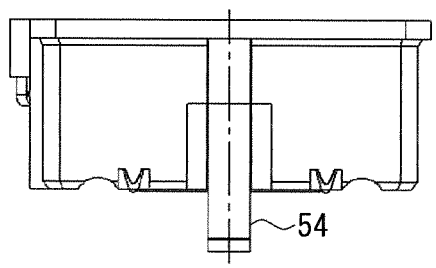
Figure 5:
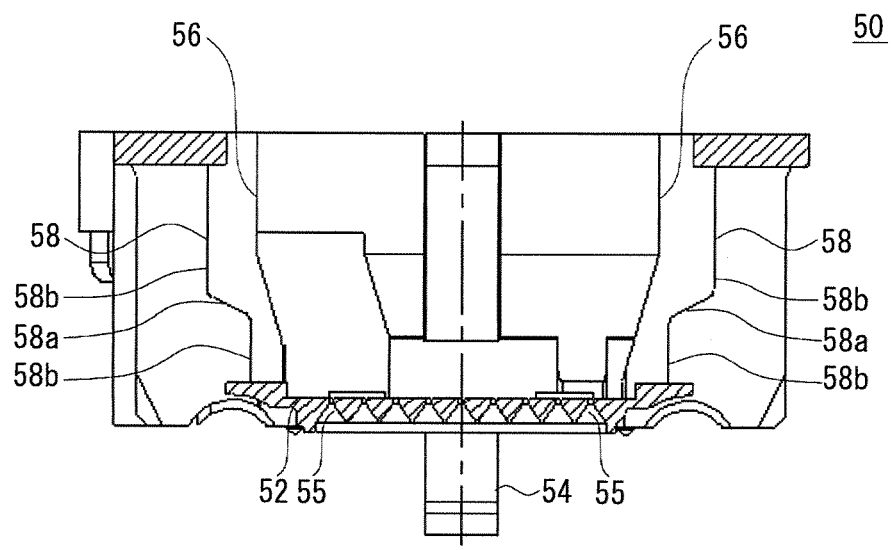
FIG. 5 is a sectional view taken at X1-X1 line in FIG. 4(a)
Figure 6:
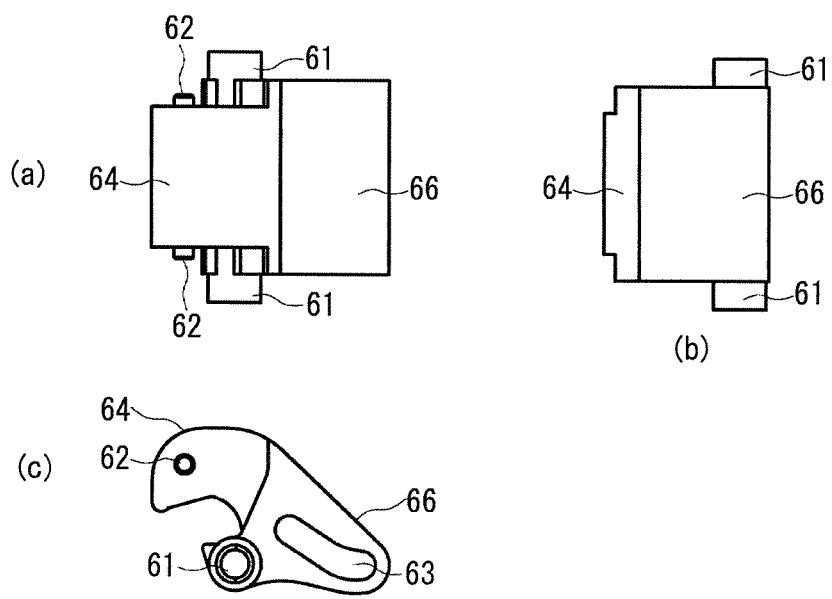
FIG. 6 shows a latch member.
Figure 7:
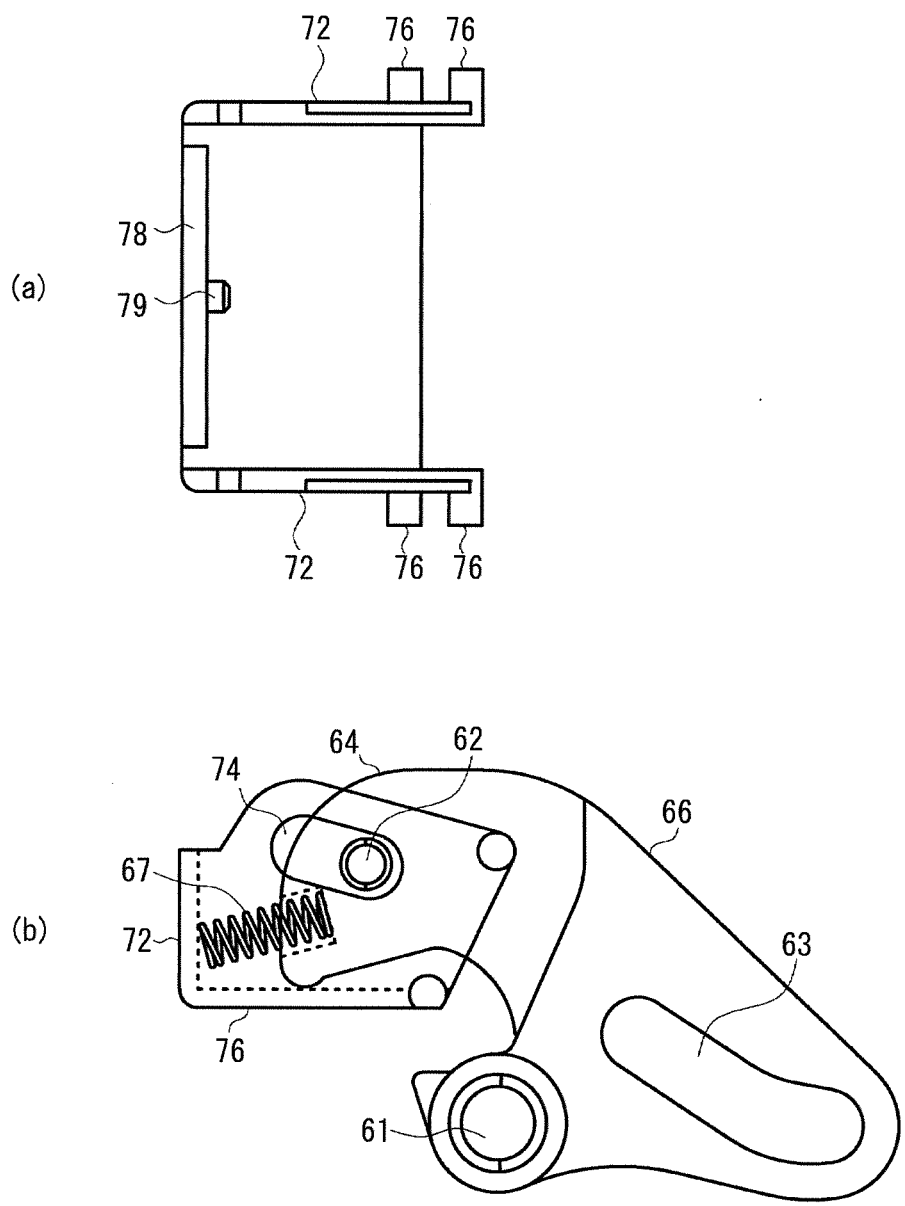
FIG. 7(a) is a plan view of a conventional latch plate.
FIG. 7(b) shows a connection of the latch member and the latch plate.
Figure 12:
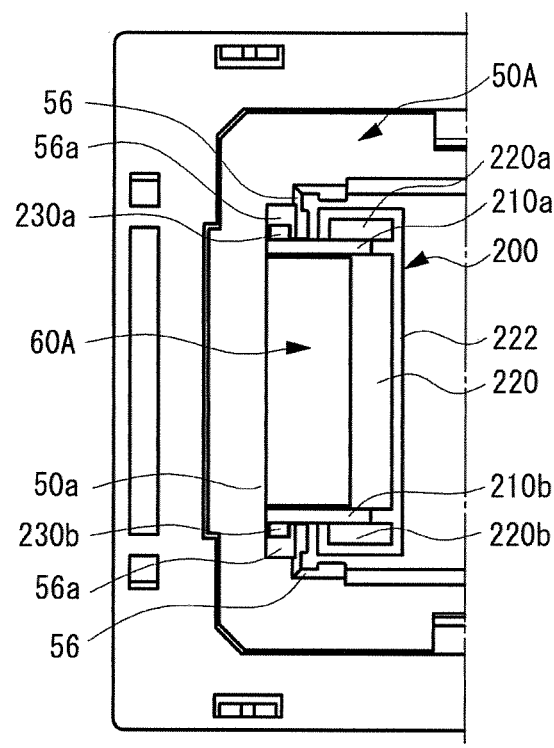
FIG. 12 is a plan view showing the relationship between the latch plate and the latch member according to an embodiment of the present invention.

FIG. 12 shows the relationship between the latch member 60A and the latch plate 200 when the BGA package 1 is removed from the position shown in FIG. 8. The latch member 60A according to this embodiment has substantially the same configuration as the conventional latch member 60, except that the latch member 60A does not need the axis members 62 of the conventional latch member 60 as shown in FIG. 6 for rotatably supporting the latch plate 70. When the latch member 60A presses the BGA package 1, the latch member 60A is placed in a space between the sidewalls 210a, 210b of the latch plate 200 and the top of the latch member 60A presses the BGA package 1 through the pressing portion 220.

Figure 9:
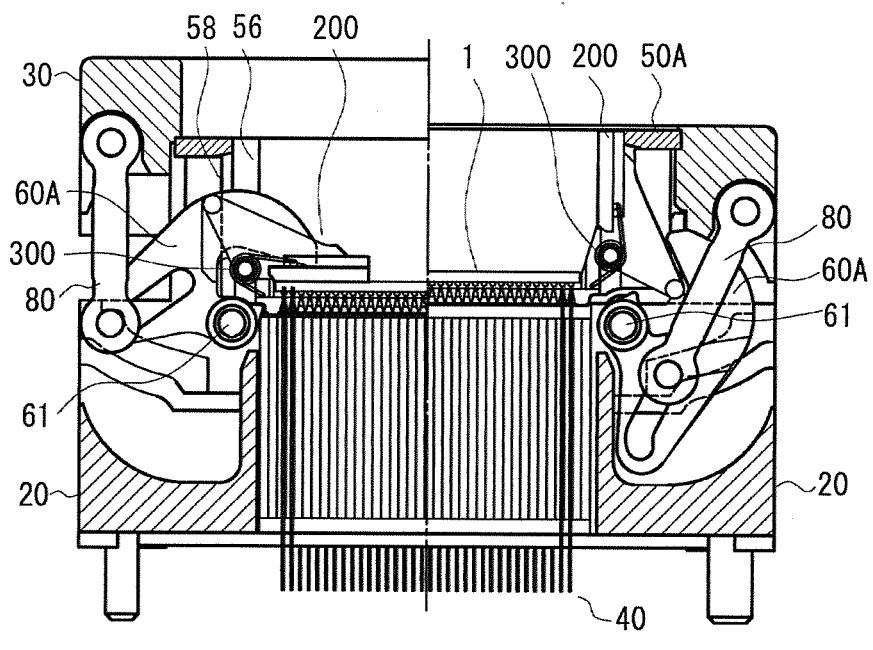
FIG. 9 is a sectional view taken at X2-X2 line of the socket according to an embodiment of the present invention.

Next, the operation of the socket according to the embodiment of the present invention is explained. When the IC package is to be mounted, the cover member 30 is pushed down from the open position as show in the left side of FIG. 9. In response to the movement downward, the link 80 is rotated and the latch member 60A is rotated around the axis member 61 by the rotation of the link 80. Thus, the top of the latch member 60A is started to be moved to its evacuated open position separated from the mounting surface 52 of the adaptor 50A. At the same time, the latch plate 200 is started to be released from the latch member 60A, so that the latch plate is rotated so as to be separated from the mounting surface 52 due to the force of the coil spring 300. Now, the latch plate 200 is positioned so that the end of the latch plate 200 can be abutted to a stopper 50a of the adaptor 50A. At this moment, the tabs 220a, 220b at both sides of the latch plate 200 are received in the notch portion 56a, the pressing portion 220 of the latch plate 200 becomes nearly upright, and the bottom surface of the pressing portion 220 is aligned with the guide 56 of the adaptor 50A or behind the guide 56. Now, the BGA package 1 can be dropped through the opening 35 of the cover member 30, and then positioned by the guide 56 and/or the bottom surface of the pressing portion 220, and eventually seated on the mounting surface 52. At this same time, the top end of each contact 40 is not projecting from the mounting surface 52, thus each contact 40 is not contacted with the solder balls of the BGA package 1.

Figure 13:
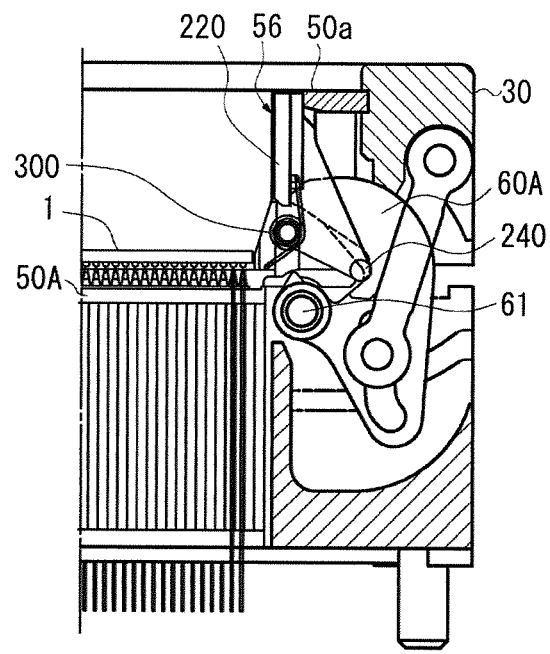
FIG. 13 is an exemplary sectional view showing movement of a socket according to an embodiment of the present invention.
Figure 14:
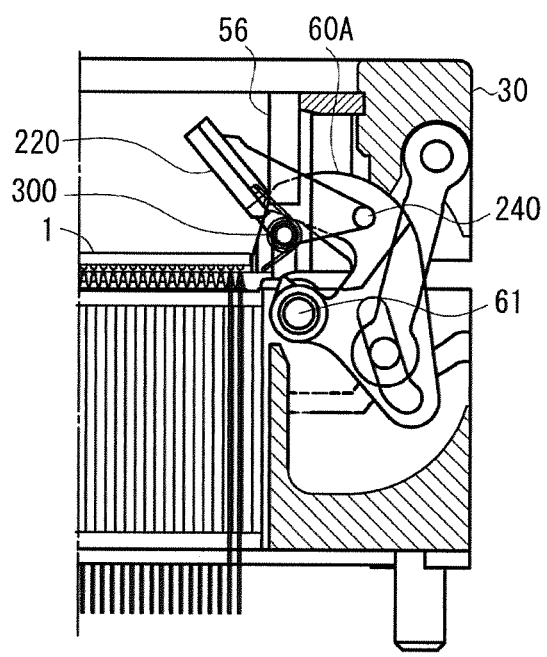
FIG. 14 is an exemplary sectional view showing movement of a socket according to an embodiment of the present invention.

Next, as the force for pressing the cover member 30 is gradually reduced after the mounting of BGA package 1, the cover member 30 moves upward. In response to this movement, the link 80 is also moved upward and the one end of the link 80 makes the latch member 60A rotate around the axis member 61 so that the top of the latch member 60A can be rotated. Then, latch member 60A is rotated by a predetermined angle, and then the top of the latch member 60A is contacted with the pressing portion 220 of the latch plate 200. FIG. 13 shows this condition. As the cover member 30 is continuously moved upward, the latch member 60A is further rotated. At this moment, the latch member 60A is rotated together with the latch plate 200 against the coil spring 300 as shown in FIG. 14.

Figure 15:
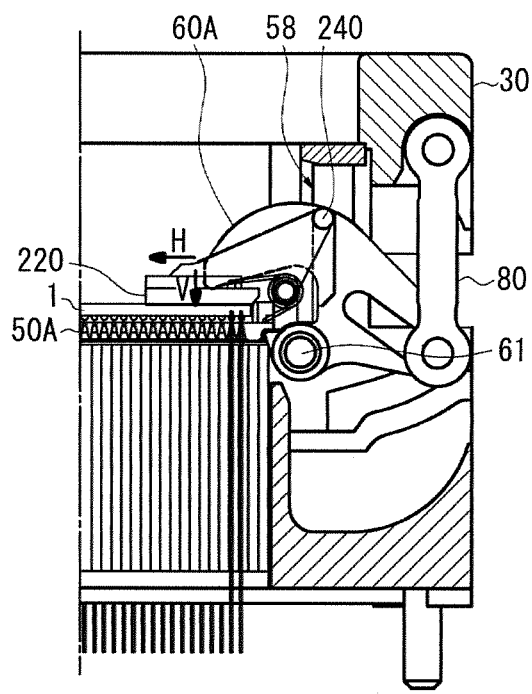
FIG. 15 is an exemplary sectional view showing movement of a socket according to an embodiment of the present invention.

Next, as the cover member 30 is further moved upward, the latch member 60A is rotated around the axis member 61, and the guide 240 of the latch plate 200 is contacted with the latch plate guide portion 58 of the adaptor 50A just before the latch member 60A is contacted with the top surface of the BGA package 1 on the mounting surface 52 as shown in FIG. 15. Thereafter, the rotation of the latch plate 200 is restricted and the latch plate 200 is moved within the longitudinal hole 59a only in the vertical direction. Although the latch member 60A is further continued to rotate around the axis member 61 in response to the movement of the cover member 30, the top of the latch member 60A is slid in the horizontal direction H on the top surface of the pressing portion 220 and presses the latch plate 200 in the vertical direction V due to the rotation of the latch plate 200 being restricted. In other words, the latch member 60A is slid in the horizontal direction H on the latch plate 200 while moving together with the latch plate 200 which moves in the vertical direction during pressing.

Due to the pressing force/movement of the latch member 60A and the latch plate 200 in the vertical direction, the adaptor 50A moves downwardly against the spring urging force on it so that the top end of each contact 40 is projected from the mounting surface 52 of the adaptor 50A to make contact with each solder ball of the BGA package 1. As shown in FIG. 8 the BGA package 1 has a size corresponding to the mounting surface of the adaptor 50A. In the conventional latch plate, the area for pressing package 1 is limited by the width of the latch plate (space between the pair of the sidewalls 210a, 210b). In other words, the conventional latch plate cannot press the entire surface of the BGA package. In contrast, the latch plate 200 according to this embodiment increases the pressing area compared with the conventional latch plate by having the additional pressing area of tabs 220a, 220b extending outside the sidewalls 210a, 210b.

When the BGA package is to be removed, the cover member 30 is pushed down from the top, open position which causes the latch plate 60A to be rotated from the pressing position to the evacuated position. The latch plate 200 is restricted to move at vertical direction until the guide 240 is disengaged with the latch plate guide portion 58 of the adaptor 50A. After disengagement, the latch plate 200 is rotated around the axis members 232a, 232b (shown in FIG. 10) and is opened as shown in the right side of FIG. 9.

Figure 16:
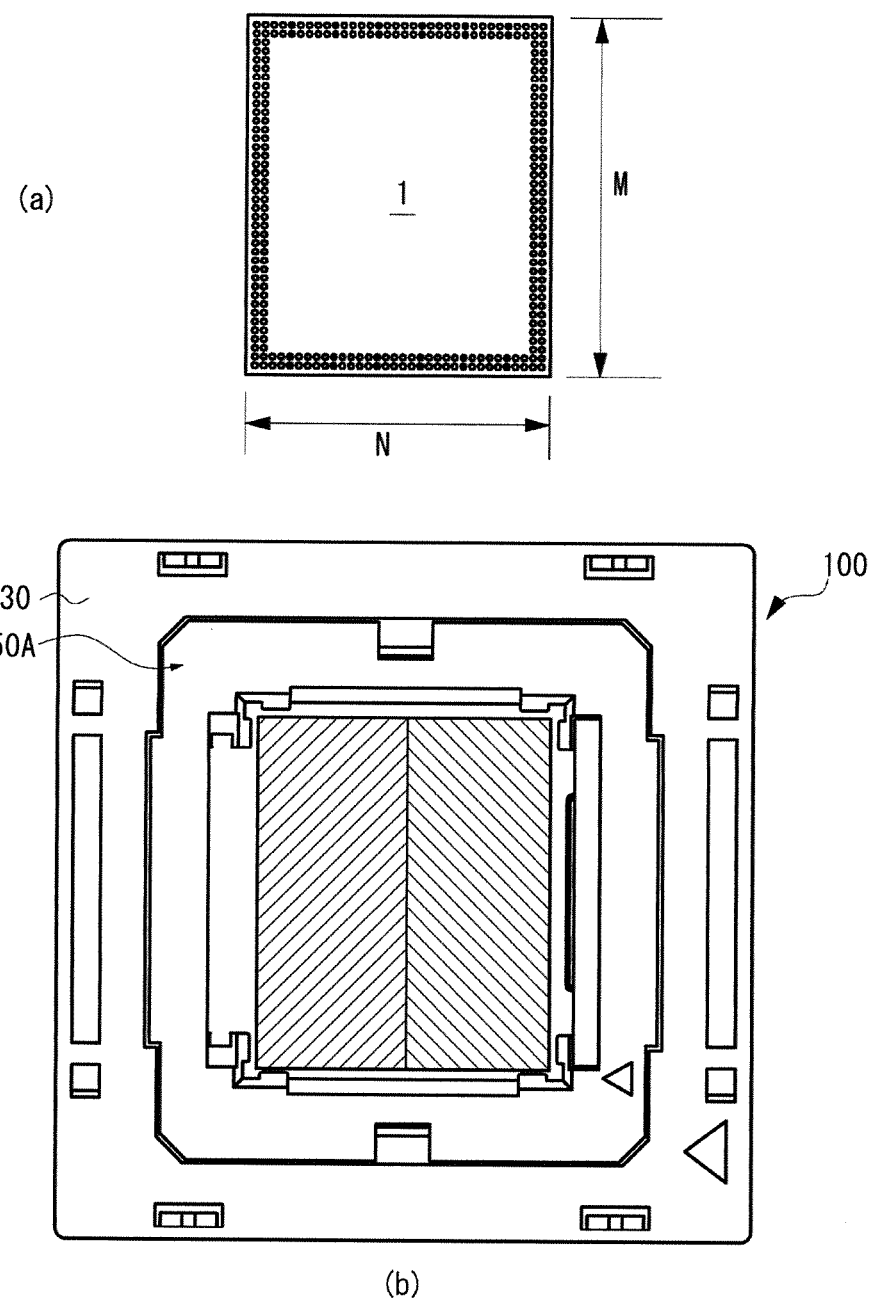
FIG. 16 is a socket according to another embodiment of the present invention.

Another embodiment according to the present invention is explained hereinafter. FIG. 16(a) shows a schematic planar view of the BGA package with the external dimension M×N. A pair of latch plates 200 is attached with the socket, the width W of each latch plate 200 is equal to the length M of the package and the length L is substantially equal to half of the length N. The cross-hatching area of FIG. 16(b) shows the area pressed by the latch plate is substantially all of surface of the BGA package. Accordingly, with this embodiment, the entire surface of the BGA package can be pressed uniformly by the latch plate 200.

Although the preferred embodiment according to the present invention has been described, variations and modifications that may occur to those skilled in the art, should be considered to be within the scope of the present invention.

What is claimed:

1. A socket for testing an electronic device comprising:
a base member,
a cover member removably attached with the base member, the cover member reciprocating between being separated from the base member mad adjacent to the base member;
a plurality of contacts, each contact fixed with the base member and having an elastically deformable portion between first and second ends;
a latch member rotatably supported on the base member, the latch member rotating in response to movement of the cover member, the latch member being in a first position when the latch member can press the electronic device mad the cover member is in a separated position from the base member, and the latch member being in a second evacuated position when the cover member is in an adjacent position to the base member;
a mounting member attached with the base and providing a mounting surface for the electronic device, the mounting member movable in a rising and falling direction in response to the movement of the cover member; and
a latch plate rotatably attached with the mounting member and urged at a first direction by an elastic member;
wherein the mounting member is formed with a latch plate guide that moves the latch plate in the vertical direction when the latch plate is in the first pressable position to press the electronic device; mad
wherein the latch member makes the latch plate rotate in a second direction opposed to the first direction by contacting the latch plate when the latch member is moved from the second evacuated position to the first pressable position;
wherein the latch plate includes a pair of sidewalls and a pressing portion connecting the sidewalls, the pair of sidewalls formed with axis portion that is rotatably engaged with the mounting member, opposing ends of the pressing portion formed with tabs that extend outside the sidewalls.

2. The socket according to claim 1, wherein the latch plate includes a flat surface, the flat surface being nearly parallel to the surface of the electronic device when the latch plate moves in the vertical direction and the latch member is in the first pressable position.

3. The socket according to claim 1, wherein a pair of latch members are disposed in opposition of each other and a pair of latch plates are disposed so as to be corresponded to the pair of latch members, the pair of latch plates pressing substantially whole surface of the electronic device.

4. The socket according to claim 1, wherein the mounting member is formed with guides for introducing the electronic device into the socket and wherein the pressing portion of the latch plate is positioned at the same position as the guides or behind the guides when the latch plate is rotated in the first direction.

5. The socket according to claim 1, wherein the latch plate includes a projecting portion, the projecting portion sliding in the vertical direction along the latch plate guide of the mounting member.

6. The socket according to claim 1, wherein the latch plate includes a pair of sidewalls and a pressing portion connecting the sidewalls, the pressing portion having a first flat main surface which is contactable with the top surface of the electronic device, the latch member received between the sidewalls, the pressing portion of the latch member pressing a second main surface of the latch plate opposing to the first main surface.

7. The socket according to claim 6 further comprising a coil spring that urges the latch plate in the first direction, the coil spring wound around an axis.

8. The socket according to claim 6, wherein the pressing portion of the latch member slides on the second main surface of the latch plate as the latch plate is pushed down vertically by the rotation of the latch member.

9. The socket according to claim 1, wherein the mounting member is formed with a plurality of through holes at the mounting surface, each through hole corresponding to each contact, the first end of each contact projected from the mounting member through each through hole when the mounting member is moved toward the base member and the first end of each contact remaining in each through hole when the mounting member is moved at the separated direction from the base member.

* * * * *